(12) United States Patent
Bae et al.

(10) Patent No.: US 10,892,532 B2
(45) Date of Patent: Jan. 12, 2021

(54) ELECTRONIC IMPEDANCE TUNING APPARATUS FOR MEASURING LOAD-PULL OF MOBILE AMPLIFIER AND ELECTRONIC IMPEDANCE TUNING METHOD THEREFOR

(71) Applicant: Industry-University Cooperation Foundation Hanyang University Erica Campus, Gyeonggi-do (KR)

(72) Inventors: Young Hwan Bae, Gyeonggi-do (KR); Jung Hyun Kim, Gyeonggi-do (KR)

(73) Assignee: INDUSTRY-UNIVERSITY COOPERATION FOUNDATION HANYANG UNIVERSITY ERICA CAMPUS, Gyeonggi-do (KR)

(*) Notice: Subject to any disclaimer, the term of this patent is extended or adjusted under 35 U.S.C. 154(b) by 359 days.

(21) Appl. No.: 16/084,004

(22) PCT Filed: Nov. 8, 2016

(86) PCT No.: PCT/KR2016/012769
§ 371 (c)(1),
(2) Date: Sep. 11, 2018

(87) PCT Pub. No.: WO2017/155179
PCT Pub. Date: Sep. 14, 2017

(65) Prior Publication Data
US 2020/0295421 A1    Sep. 17, 2020

(30) Foreign Application Priority Data

Mar. 11, 2016    (KR) .................. 10-2016-0029789

(51) Int. Cl.
*H01P 5/18* (2006.01)
*H01P 1/06* (2006.01)
*G01R 31/28* (2006.01)

(52) U.S. Cl.
CPC ................ *H01P 1/061* (2013.01); *H01P 5/18* (2013.01); *G01R 31/2822* (2013.01)

(58) Field of Classification Search
CPC .................................. H01P 5/18; H01P 5/184
(Continued)

(56) References Cited

U.S. PATENT DOCUMENTS

| | | | |
|---|---|---|---|
| 5,625,328 A * | 4/1997 | Coleman, Jr. ........... | H01P 5/185 333/116 |
| 8,947,317 B2 * | 2/2015 | Ueda .................... | H03H 7/0115 343/860 |

(Continued)

FOREIGN PATENT DOCUMENTS

| | | |
|---|---|---|
| JP | 2007-535828 A | 12/2007 |
| KR | 10-1998-0083779 A | 12/1998 |

(Continued)

OTHER PUBLICATIONS

International Search Report dated Feb. 10, 2017, issued in corresponding International Application No. PCT/KR2016/012769, filed Nov. 8, 2016, 5 pages.

*Primary Examiner* — Dean O Takaoka
(74) *Attorney, Agent, or Firm* — Christensen O'Connor Johnson Kindness PLLC (57) ABSTRACT

Disclosed are an electronic impedance tuning apparatus for measuring a load-pull of a mobile amplifier and an electronic impedance tuning method therefor. An electronic impedance tuning apparatus according to one embodiment of the present invention comprises: a coupler for transferring, to transmission lines respectively connected to a through port and a coupled port, an input voltage inputted to an input port; a magnitude part for controlling a change in the magnitude of the impedance through a change in length difference of the transmission lines; and a phase part for (Continued)

controlling a change in the phase of the impedance through an equal length change of the transmission lines.

13 Claims, 9 Drawing Sheets

(58) Field of Classification Search
USPC .......................................... 333/109–112, 116
See application file for complete search history.

(56) References Cited

U.S. PATENT DOCUMENTS

| 2004/0189380 | A1* | 9/2004 | Myer | H03F 3/602 |
| | | | | 330/124 R |
| 2012/0119971 | A1 | 5/2012 | Bae | |
| 2013/0063222 | A1* | 3/2013 | Acimovic | H01P 5/184 |
| | | | | 333/27 |

FOREIGN PATENT DOCUMENTS

| KR | 10-2004-0048005 A | 6/2004 |
| KR | 10-2013-0113240 A | 10/2013 |

\* cited by examiner

ELECTRONIC IMPEDANCE TUNING APPARATUS FOR MEASURING LOAD-PULL OF MOBILE AMPLIFIER AND ELECTRONIC IMPEDANCE TUNING METHOD THEREFOR

TECHNICAL FIELD

The present invention relates to an electronic impedance tuning technology, and more particularly, relates to an electronic impedance tuner, a tuning apparatus, and a tuning method, capable of generating a constant impedance for load-pull measurement of an amplifier.

BACKGROUND ART

One of fields, in which an impedance tuner is most widely used, is to measure load-pull of a power amplifier (PA) under an antenna mismatch condition. In particular, a mechanical tuner has been used for many applications due to higher accuracy, a wider impedance range, the processing of higher power, and a regular programmable operation.

However, the mechanical tuner has disadvantages such as higher costs, a larger volume, a heavier weight, and a slower operation speed. In addition, the mechanical tuner has an impedance range which is too wide to measure load pull of a mobile PA.

Phone vendors require that the PA satisfies RF system requirements, such as linearity, under an antenna mismatch condition of a standing wave ratio (SWR) of 6 or less, and ensures PA robustness, such as ruggedness and stability, in the state that the SWR is infinite. This means that the PA satisfies the conditions of the linearity and the robustness under the output condition of the SWR of 2.5 or less and the output condition of the SWR of 6 or less on the assumption that the PA loss between the PA output stage and the antenna is 2.5 dB or more.

Accordingly, the high-speed electronic tuner may be a solution good for the measurement of the load-full of the PA. In this case, the high-speed electronic tuner may cover two SWRs, may have a smaller size, may require a lower cost, and may represent a higher speed characteristic. However, the high-speed electronic tuner may have the limitation in realizing the higher SWR impedance.

Therefore, until now, studies and researches have been performed with respect to electronic tuners in various shapes of employing a load line and/or a stub-based structure. However, the reported electronic tuners cover only the partial phase angle instead of the whole phase angle at the higher level SWR impedance.

Figure 1:
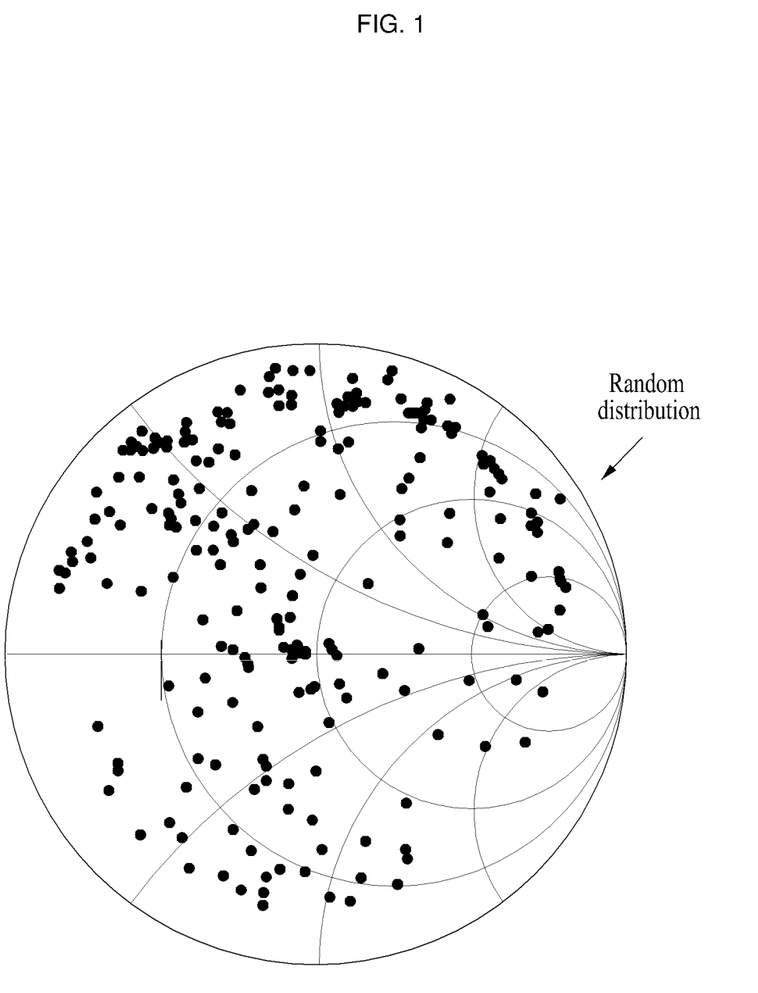
FIG. 1 illustrates the distribution of impedances produced by a conventional electronic impedance tuner.

In addition, according to the conventional electronic tuner, as illustrated in FIG. 1, since an impedance is implemented in a random process, it is difficult to regularly implement a specific impedance which is required.

In other words, since a conventional electronic tuner has the biggest problem with the difficulty in implementing the constant impedance, a user has a limitation in the measurement of load-full in a real industrial field.

Accordingly, there is a necessity for the electronic impedance tuner capable of producing the constant impedance.

DETAILED DESCRIPTION OF THE INVENTION

Technical Problem

Embodiments of the present invention provide an electronic impedance tuning apparatus capable of producing a constant impedance for measuring load-full of an amplifier, and a method for the same.

Technical Solution

According to an embodiment of the present invention, an electronic impedance tuning apparatus includes: a coupler to transmit an input voltage, which is applied to an input port, to transmission lines linked to a through port and a coupled port; a magnitude part to control a magnitude change of an impedance by changing a length difference between transmission lines; and a phase part to control a phase change of the impedance based on the same length change of the transmission lines.

The magnitude part may control only a length change of the transmission line linked to the through port, and may maintain a length of the transmission line, which is linked to the coupled port, in a fixed state.

The magnitude part may control the length change of the transmission line linked to the through port by linking a plurality of transmission lines, which have different lengths, to the through port in parallel and by selecting at least one of the plurality of transmission lines.

The sum of electrical phases of the transmission lines constituting the magnitude part may be 90°

The phase part may be interposed between the magnitude part and a terminal connected to a short circuit, and may identically vary a length of each of the transmission lines to maintain the length difference between the transmission lines based on a magnitude of an impedance which is determined by the magnitude part.

The phase part may include: a start-point part having a plurality of transmission lines making a first phase difference having a specific angle and linked to each other in parallel, and selecting at least one of the transmission lines to determine a primary phase; and a loaded-line part having a plurality of transmission lines, which have a second phase difference having a specific angle and are linked to each other in series, and determining one of the transmission lines, which are linked to each other in series, as a short termination point to determine the final phase.

The coupler may include a 3-dB 90° directional coupler.

According to an embodiment of the present invention, an electronic impedance tuning method includes: transmitting an input voltage to transmission lines linked to a through port and a coupled port of a coupler by using the coupler; controlling a magnitude of an impedance by changing a length difference between the transmission lines; and controlling a phase of the impedance by identically changing lengths of the transmission lines.

The controlling of the magnitude of the impedance may include controlling only a length change of the transmission line linked to the through port, and maintaining n a length of the transmission line, which is linked to the coupled port, in a fixed state.

The controlling of the magnitude of the impedance may include controlling the length change of the transmission line linked to the through port by selecting at least one of a plurality of transmission lines having different lengths and liked to the through port in parallel.

The controlling of the magnitude of the impedance may include controlling length changes of the transmission lines such that the sum of electrical phases of the transmission lines is 90°.

The controlling of the magnitude of the impedance may include identically varying a length of each of the transmission lines to maintain the length difference between the transmission lines based on a magnitude of an impedance which is determined in the controlling of the magnitude of the impedance.

The controlling of the phase of the impedance may include determining a primary phase by selecting at least one of a plurality of transmission lines linked to each other in parallel and having a first phase difference having a specific angle; and determining a final phase by determining one of a plurality of transmission lines, which are linked to each other in series and have a second phase difference having a specific angle, as a short termination point.

Advantageous Effects of the Invention

According to embodiments of the present invention, an electronic device for tuning a constant impedance, and a method for the same, so the electronic device may be utilized as load-full equipment in place of a mechanical impedance tuner.

According to embodiments of the present invention, since an electronic impedance tuner, capable of creating a constant impedance, is provided, the electronic device may have a lower cost, a higher speed, and lighter characteristics

BEST MODE

Hereinafter, exemplary embodiments of the present invention will be described in detail with reference to the accompanying drawings. However, the present invention is neither limited nor restricted by the embodiments. Further, the same reference numerals in the drawings denote the same members.

According to embodiments of the present invention, a subject matter is to provide an electronic impedance tuner, capable of producing a constant impedance to measure load pull of a PA, a tuning apparatus, and a method for the same.

In this case, according to the present invention, an electronic impedance tuning apparatus (hereinafter, referred to as "electronic impedance tuner") may employ a circuit structure in a basic coupling/reflecting form, may include a through port and a coupled port of a directional coupler, for example, a 3-dB 90° coupler. The through port and the coupled port are linked with variable transmission lines, and the transmission lines are terminated in a short circuit.

The transmission lines linked to the through port and the coupled port of the directional coupler are divided into a magnitude part and a phase part. The isolation port of the directional coupler is terminated with the resistance of 50 Ohm, so the circuit may be totally constructed in a single port circuit network.

Figure 2:
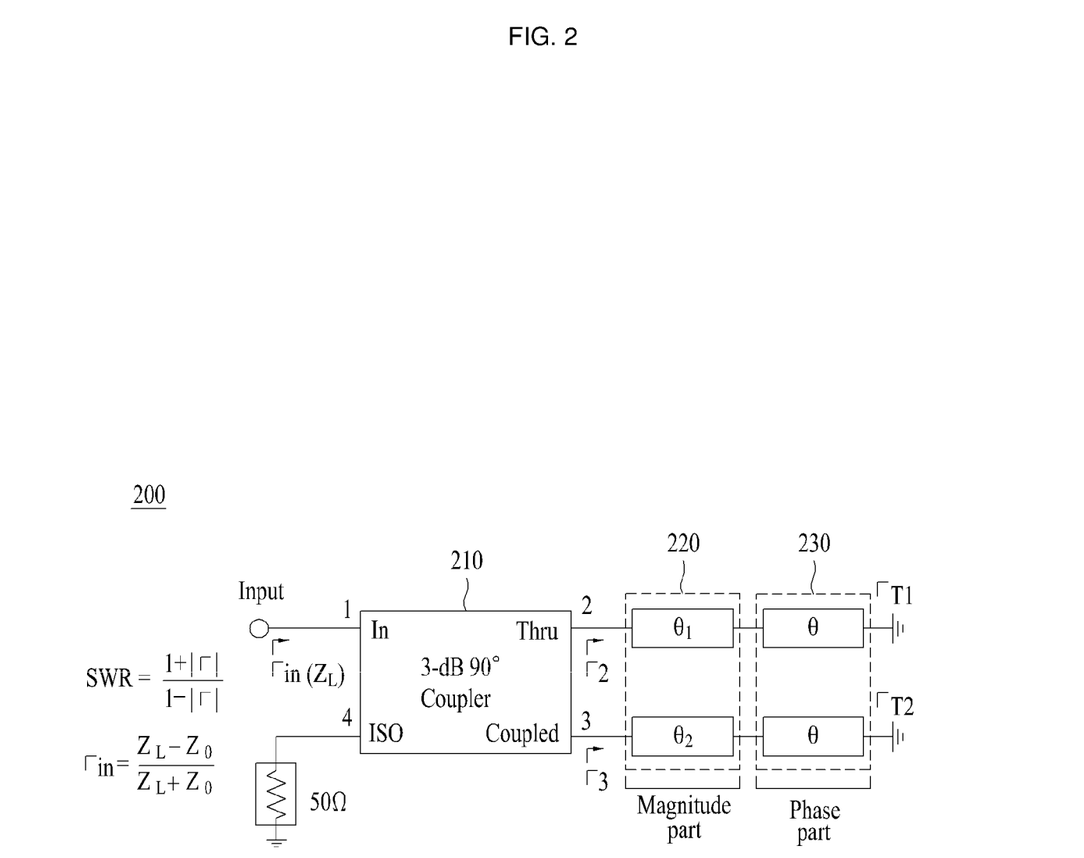
FIG. 2 is a schematic circuit diagram illustrating the electronic impedance tuning apparatus, according to an embodiment of the present invention.

FIG. 2 is a schematic circuit diagram illustrating the electronic impedance tuning apparatus, according to an embodiment of the present invention, and the electronic impedance tuning apparatus has a basic coupling/reflecting circuit structure.

As illustrated in FIG. 2, according to an embodiment of the present invention, an electronic impedance tuner 200 includes a directional coupler 210, a magnitude part 220, and a phase part 230.

The directional coupler 210 includes an input port In, an isolation port ISO, a through port Thru, and a coupled port Coupled.

The through port Thru and the coupled port Coupled of the directional coupler 210 are linked to various transmission lines, and each transmission line is terminated in a short circuit.

In addition, the isolation port ISO of the directional coupler 210 is terminated with the resistor of 50 Ohm, so the circuit is totally constructed in a single port circuit network. Further, the impedance produced from the electronic impedance tuner 200 may be checked by analyzing the reflection coefficient of the input port.

The transmission lines linked to the through port and the coupled port may be divided into the magnitude part 220 and the phase part 230 in detail.

An input voltage input applied to the input port (In) is transmitted to the through port and the coupled port. In this case, since the ports are terminated in a short circuit, the input voltage is finally reflected to the input port and the isolation port.

Therefore, the reflection coefficient $\Gamma_{in}$ at the input port In is the sum of the reflection coefficient $\Gamma_{PATH1}$ from the through port Thru and the reflection coefficient $\Gamma_{PATH2}$ from the coupled port Coupled, which is expressed as in following Equation 1.

$$\Gamma_{in} = \Gamma_{PATH1} + \Gamma_{PATH2} \qquad \text{Equation 1}$$

In this case, the reflection coefficient $\Gamma_{PATH1}$ from the through port Thru and the reflection coefficient $\Gamma_{PATH2}$ from the coupled port Coupled may be expressed as in following Equation 2.

$$\Gamma_{PATH1} = \left(\frac{-j}{\sqrt{2}}\right)\Gamma_{T1}e^{-j2(\theta_1+\theta)}\left(\frac{-j}{\sqrt{2}}\right) = -0.5\,\Gamma_{T1}e^{-j2(\theta_1+\theta)} \qquad \text{Equation 2}$$

$$\Gamma_{PATH2} = \left(\frac{-1}{\sqrt{2}}\right)\Gamma_{T2}e^{-j2(\theta_2+\theta)}\left(\frac{-1}{\sqrt{2}}\right) = 0.5\,\Gamma_{T2}e^{-j2(\theta_2+\theta)}$$

In this case, when the termination ($\Gamma_{T1}$) of the through port Thru and the termination ($\Gamma_{T2}$) at the coupled port satisfies the condition of $\Gamma_{T1}=\Gamma_{T2}=k$, the reflection coefficient of the input port may be expressed as in following Equation 3.

$$\Gamma_{in}=-0.5k(e^{-j2(\theta_1+\theta)}-e^{-j2(\theta_2+\theta)}) \quad \text{Equation 3}$$

According to the Euler formula, Equation 3 may be divided into a real part and an imaginary part and may be expressed as in following Equation 4.

$$\Gamma_{in}=-0.5k[\{\cos2(\theta_1+\theta)-\cos2(\theta_2+\theta)\}+j\{\sin2(\theta_2+\theta)-\sin2(\theta_1+\theta)\}] \quad \text{Equation 4}$$

On the assumption that $|k|=1$ as the through port and the coupled port are terminated in a short circuit, the magnitude and the phase of the final reflection coefficient of the input port, which are obtained from Equation 4, may be expressed as in FIGS. 5 and 6.

$$|\Gamma_{in}|=|\sin2(\theta_1-\theta_2)| \quad \text{Equation 5}$$

$$\angle\Gamma_{in}=\{90°-(\theta_1+\theta_2)\}-2\theta \quad \text{Equation 6}$$

In this case, when the sum of electrical phases of the transmission lines constituting the magnitude part 220 is 90°, that is, when $\theta_1+\theta_2=90°$, the magnitude and the phase of the reflection coefficient of the input port may be simplified as in Equation 7 and Equation 8.

$$|\Gamma_{in}|=|\sin(2\theta_1-90°)|=|\cos(2\theta_1)| \quad \text{Equation 7}$$

$$\angle\Gamma_{in}=-2\theta \quad \text{Equation 8}$$

As expressed in Equation 7 and Equation 8, the length $\theta_1$ of the transmission line linked to the through port in the magnitude part 220 and the length $\theta$ of the transmission line in the phase part 230 are simply controlled, so the magnitude and the phase of the reflection coefficient of the input port may be controlled.

Figure 3:
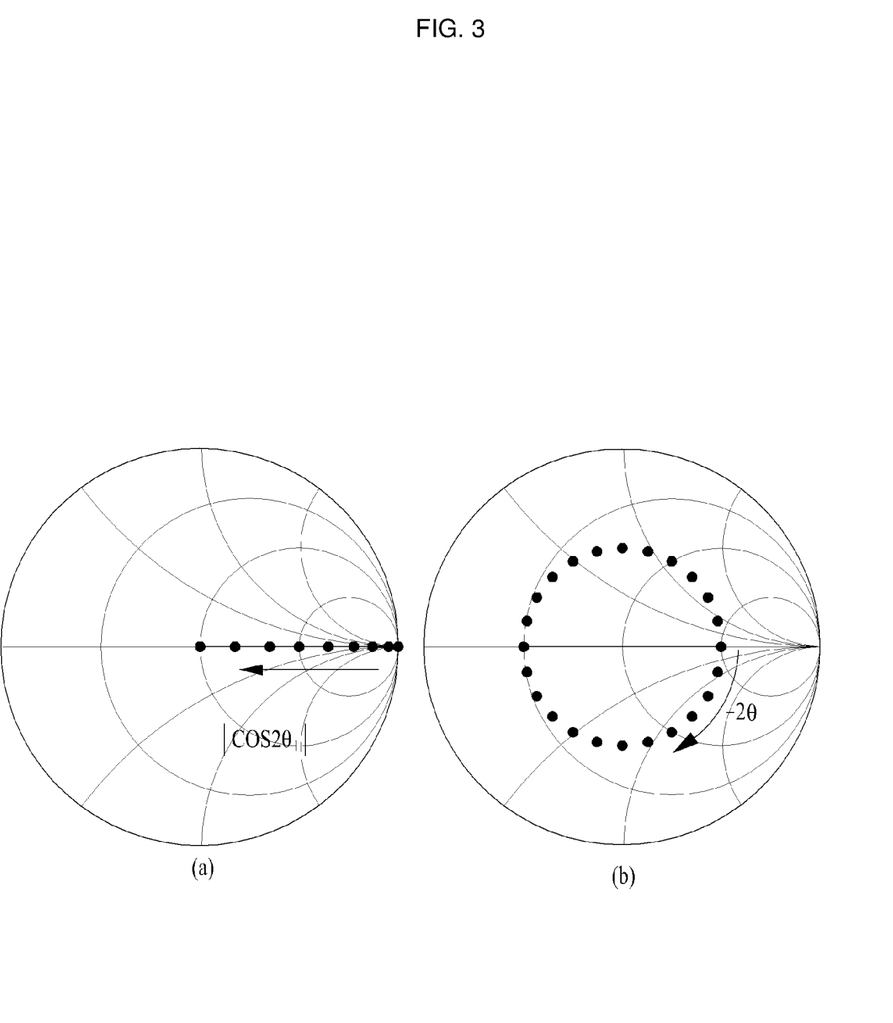
FIG. 3 illustrates the trajectories of a magnitude change and a phase change of an impedance produced from the device illustrated in FIG. 2.

FIG. 3 illustrates the trajectories of a magnitude change and a phase change of an impedance produced from the device illustrated in FIG. 2. It can be recognized through FIG. 3 that the impedance is changed in magnitude and phase based on a positive X axis on the Smith Chart. In addition, it can be recognized that the impedance magnitude trajectory of the reflection coefficient of the input port on the Smith chart based on the variation of $\theta_1$ and the impedance phase trajectory of the reflection coefficient of the input port on the Smith chart based on the variation of $\theta$ are uniform.

Figure 7:
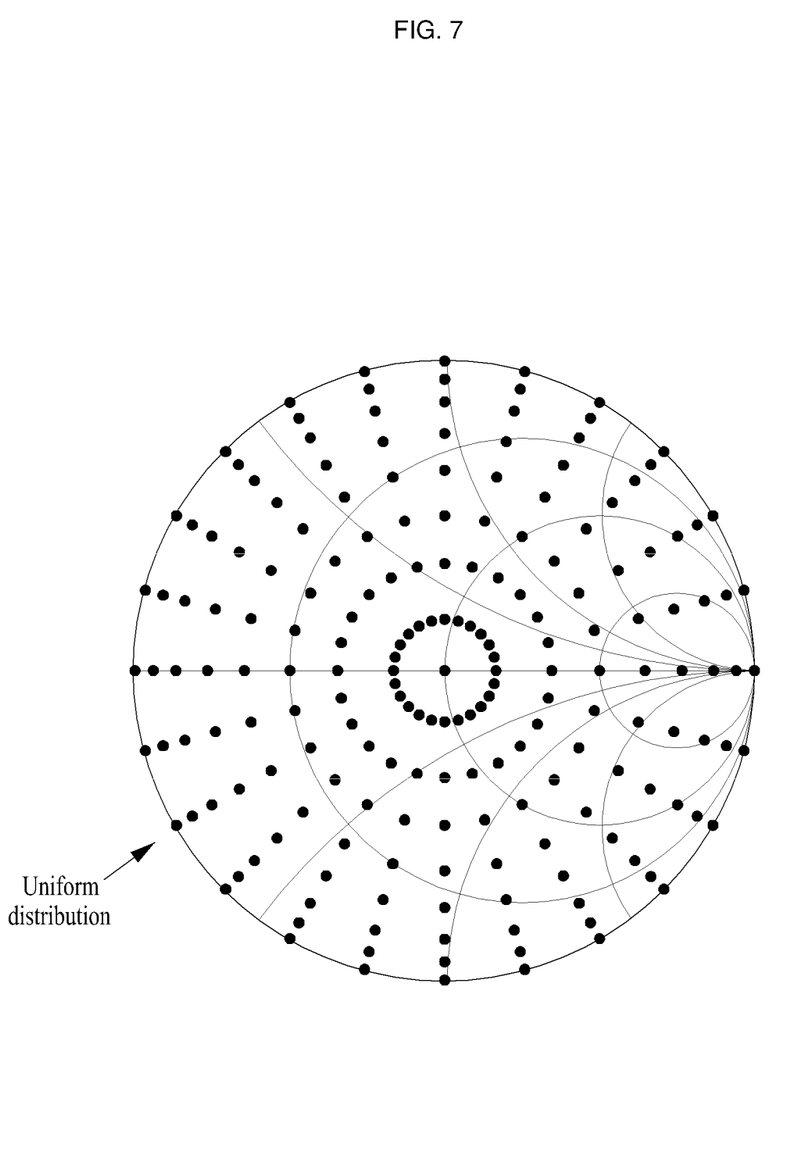
FIG. 7 illustrates a uniform impedance distribution created by the device, according to the present invention.

Therefore, according to the embodiment of the present invention, the electronic impedance tuner 200 may provide constant impedance distribution as illustrated in FIG. 7.

The magnitude part 220 controls the magnitude of the impedance produced due to the change in the difference between the lengths of transmission lines linked to the through port and coupled port. The phase part 230 controls the phase of the impedance due to the same length variation of the transmission lines linked to the through port and the coupled port.

The magnitude part 220 and the phase part 230 will be described in detail with reference to FIG. 4.

Figure 4:
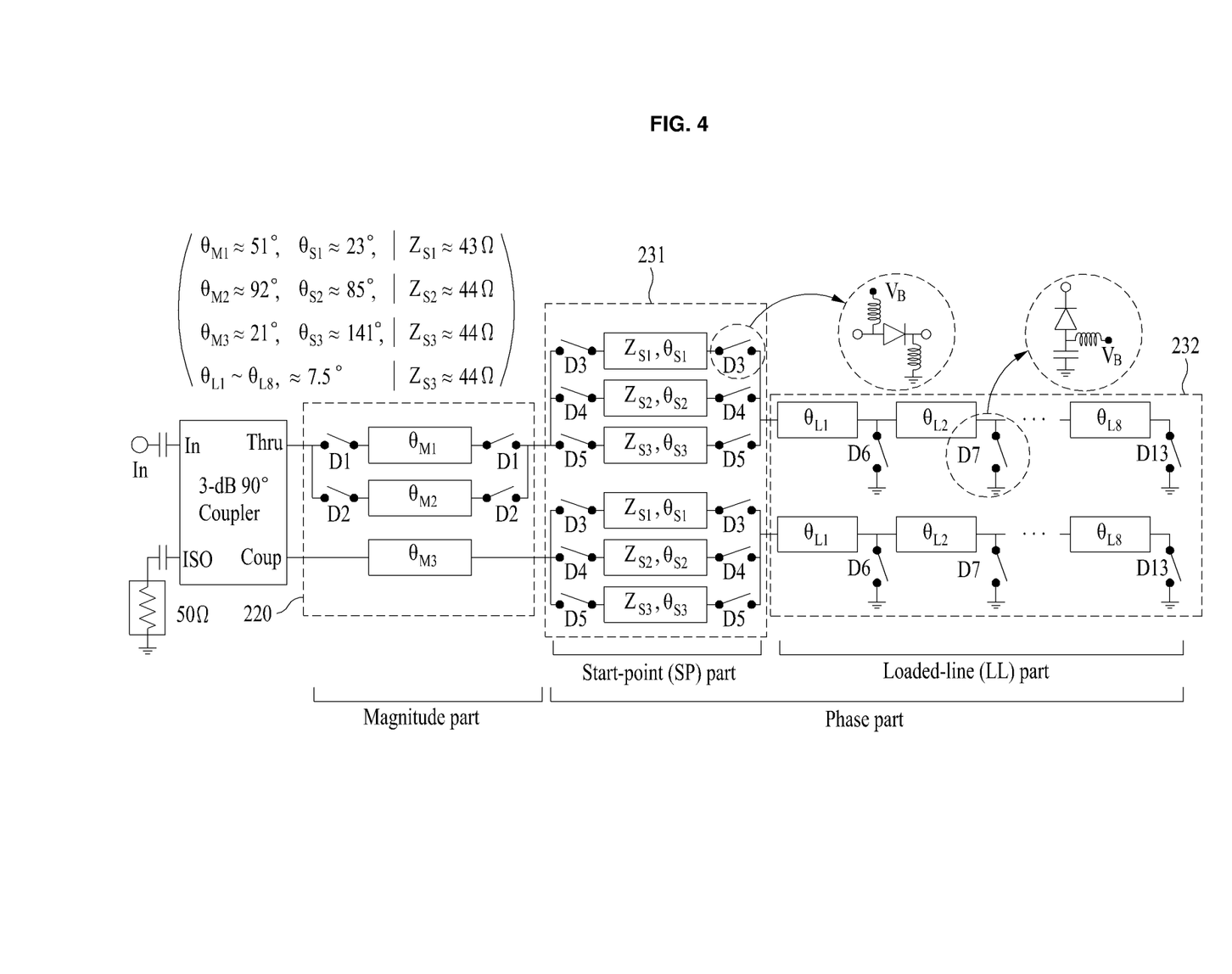
FIG. 4 illustrates a detailed circuit diagram of the device illustrated in FIG. 2 according to an embodiment.

FIG. 4 illustrates a detailed circuit diagram of the device of FIG. 2 according to an embodiment.

As illustrated in FIG. 4, the magnitude part 220 includes three transmission lines $\theta_{M1}$, $\theta_{M2}$, $\theta_{M3}$, which have mutually different lengths (phases), in total and only one of two transmission lines $\theta_{M1}$, $\theta_{M2}$ linked to the through port is selectively turned on by PIN diode (or switches) D1 and D2 to realize the structure of the variable transmission line.

In magnitude part 220, even a transmission line $\theta_{M3}$ linked to the coupled port has to be changed corresponding to the variation of transmission lines linked to the through port. However, when the number of the PIN diodes constituting the circuit is increased, the whole insertion loss of the circuit is finally increased, thereby restricting the magnitude change range of an impedance to be realized. Accordingly, the transmission line $\theta_{M3}$ of the magnitude part linked to the coupled port may be designed in a fixed shape instead of the variable shapes to reduce the insertion loss.

In addition, although description has been made in that the transmission line of the magnitude part 220 linked to the coupled port is designed in the fixed shape, the transmission lines may be designed in the variable shapes based on the total insertion loss of the circuit.

When the transmission line $\theta_{M3}$ of the magnitude part 220 linked to the coupled port is designed in the fixed shape instead of the variable shapes, the sum of the transmission lines constituting the magnitude part 220 may not be 90°. In other words, $\theta_{M1}+\theta_{M3}\neq90°$ or $\theta_{M2}+\theta_{M3}\neq90°$ This means that the start point of the produced impedance is not on the positive X axis on the smith chart, that is, the start point of the impedance is positioned up or down the X axis. However, the same result is made in that impedances having uniform phase intervals are produced at the same SWR except that the reference point is changed.

Finally, as variable transmission lines are implemented in two stages in the magnitude part 220, impedances may be produced with a constant phase interval for two different SWRs, for example, for SWRs of 2.5 and 6.

As described above, in the magnitude part 220, two transmission lines, which are linked in parallel and switchable, are linked to the through port and one transmission line having a constant impedance may be coupled to the coupled port.

In this case, at the SWRs of 2.5 and 6, $\theta_{M1}+\theta_{M3}$ may be produced to 72°, and $\theta_{M2}+\theta_{M3}$ may be produced to 113°.

Surely, when the number of the transmission lines, which are switchable, is three to control impedance magnitude change, three different SWRs may be provided. The number of the transmission lines, which are switchable, may be three depending on the number of the SWRs to be provided.

The phase part 230 may be divided into a start-point part 231 and a loaded-line part 232. The transmission lines in the phase part 230, which are linked to the through port and the coupled port, are varied in phase to change only the phase while maintaining the magnitude determined by the magnitude part 220.

To reduce the insertion loss in the whole circuit, the phase part 230 is constituted with the start-point part 231 and the loaded-line part 232, and the loaded-line part 232 is repeatedly utilized corresponding to the variation of the start-point part 231, thereby minimizing the use of the PIN diode.

Figure 5:
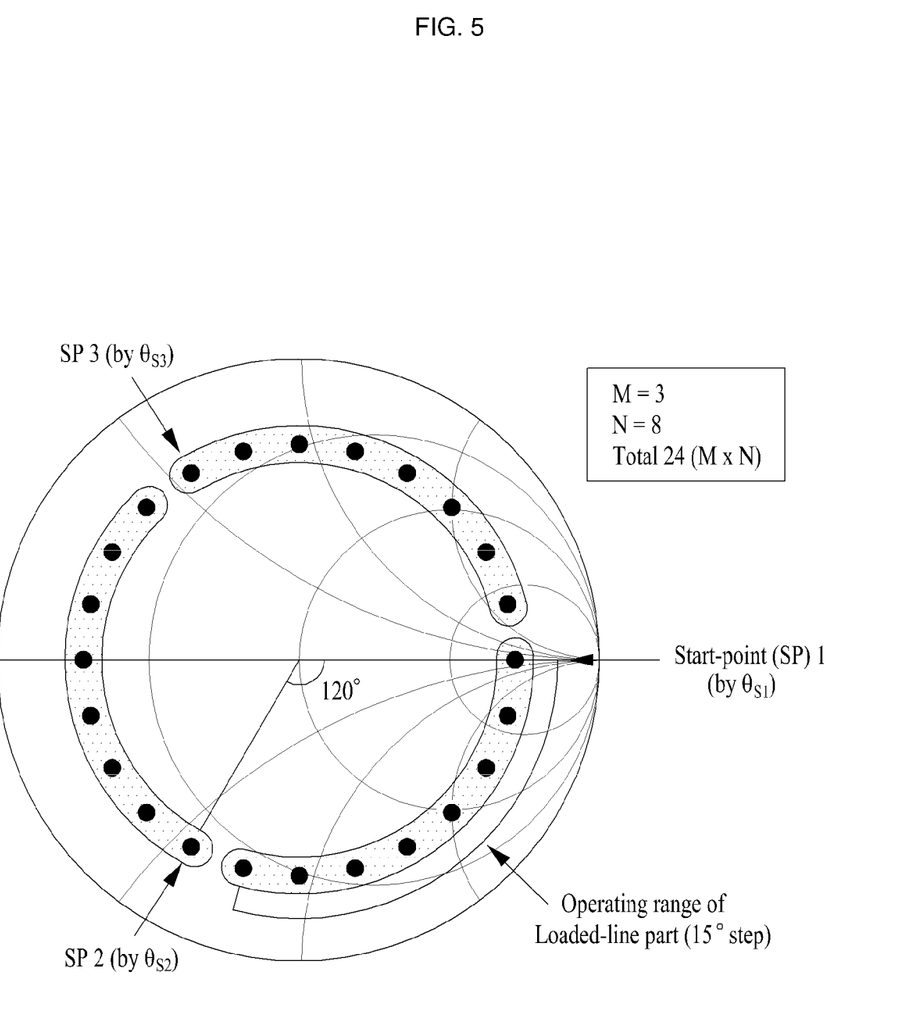
FIG. 5 illustrates a phase change of an impedance by a start-point part and a loaded-line part illustrated in FIG. 4.

The start-point part 231 is switchable at one port and the total of three transmission lines ($\theta_{S1}$, $\theta_{S2}$, $\theta_{S3}$) having the electrical phase difference of about 60° are formed in parallel. Only one transmission line among three transmission lines is selectively turned on by the PIN diode (D3 to D5). Finally, the impedance phase difference may be made at the interval of 120° on the smith chart as illustrated in FIG. 5 through Equation 8.

When the primary phase of the impedance is determined by the transmission line of the start-point part 231, the secondary phase is determined by the operation of the loaded-line part 232.

In this case, the loaded-line part 232 may include eight transmission lines switchable and linked to each other in series with a constant phase difference, for example, the electric phase difference of 7.5°.

The transmission lines $\theta_{L1}, \theta_{L2}, \ldots, \theta_{L8}$ in the loaded-line part 232 are configured with the electric phase of about 7.5°, and may cause, finally, the phase difference of 15° on the smith chart through Equation 8.

The loaded-line part 232 employs a basic loading line structure to vary the phases of the transmission lines, and the basic loading line structure is a structure in which a short termination point is determined by turning on the PIN diodes D6 to D13 arranged at regular distances on the transmission lines.

In the phase part 230, as illustrated in FIG. 4, the circuit linked to the through port and the circuit linked to the coupled port may be identically configured to each other.

In this case, when the start-point part 231 includes M transmission lines, the electrical length difference of "360°/2M" is made between the transmission lines, and when the loaded-line part 232 includes N transmission lines, each transmission line has the electric length of "360°/(2×M×N)" and the phase angle step of "360°/(M×N)" may be made on the smith chart. Accordingly, when compared with the case without the start-point (SP) 231, the number of the transmission lines constituting the phase part 230 may be reduced from "M×N" to "M+N" for each port.

Accordingly, the phase part 230 may uniformly change the phase angle with the phase angle step of 15° on the Smith chart as illustrated in FIG. 5.

In this case, since $\theta_{M3}$ is fixed as illustrated in FIG. 4, $\theta_{M1}+\theta_{M3}$ becomes the electrical phase of 72°, $\theta_{M2}+\theta_{M3}$ becomes the electrical phase of 113°, which is out of 90° and thus causes the phase offset. The phase angle of the reflection coefficient for $\theta_{M1}+\theta_{M3}$ becomes "18°-2θ" on the Smith chart, and the phase angle of the reflection coefficient for $\theta_{M2}+\theta_{M3}$ becomes "−23°-2θ" on the Smith chart.

Accordingly, the offset maintains a constant phase angle step while moving the start point of the phase angle.

The phase part 230 may determine the number of possible impedance phases in the same impedance magnitude based on the number M of transmission lines in the start-point part 231 for one port and the number N of transmission lines in the laded-line part 232. For example, the phase part 230 may determine the number of impedance phases to 24 when the number of the transmission lines is "3" in the start-point part of one port and the number of the transmission lines is "8" in the loaded-line part.

As described above, the path of each of the through port and the coupled port form a short circuit by closing the switches of the loaded-in part, and only one switch of each part is turned on at one time.

According to an embodiment of the present invention, the electronic impedance tuner may provide constant impedance phase distribution with the phase difference of 15° on the Smith chart and may provide a plurality of impedance magnitude (SWR) depending on the number of transmission lines which are switchable in the magnitude part. Accordingly, the circuit may be configured in a singular form.

Figure 6:
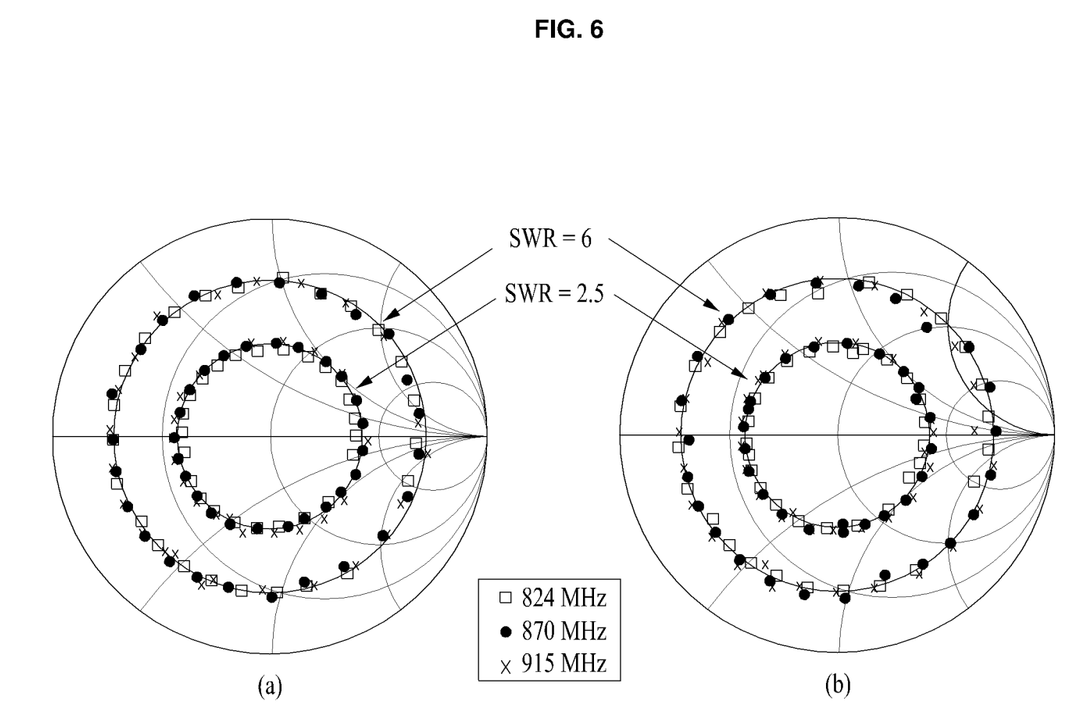
FIG. 6 is a view illustrating a simulation result and a measurement result, according to one embodiment of the present invention.

FIG. 6 illustrates the simulation result and the measurement result for the electronic impedance tuner manufactured in the size of 100×50 mm² to have the operating frequency range of 824-915 MHz using an MA4P161-134 PIN diode (Ron=1.5 Ohm and Coff=90fF) manufactured in MA-COM, RO4350b PCB manufactured by Rogers and having the thickness of 10-mil, and an XC0900E-03S chip coupler manufactured by Anaren.

In this case, the manufactured electronic impedance tuner may apply a DC voltage of −25 V to a PIN diode in an inactive state to minimize the parasitic component of the PIN diode and to maximize the power processing capability of the tuner, In addition, the last PIN diode in the loaded-in part may be always in an active state to minimize the unnecessary influence of the transmission lines after a short termination point determined in the loaded-line part.

As recognized through the simulation result of the electronic impedance tuner according to the present invention in FIG. 6A, the electronic impedance tuner may have the constant impedance distribution in the operating frequency range of 824-915 MHz. In addition, as recognized the measurement result of the electronic impedance tuner according to the present invention in FIG. 6B, impedances having 24 uniform phases may be produced at each of SWRs of 2.5 and 6 similarly to the simulation result.

In addition, it may be recognized from FIG. 6B that the electronic impedance tuner has a significantly constant impedance distribution with the magnitude variation of 0.05 and 0.08 or less and the phase variation of 5° or less at the SWRs of 2.5 and 6 based on the measurement result. Accordingly, it may be recognized that the simulation result is sufficiently matched with the measurement result.

Figure 8:
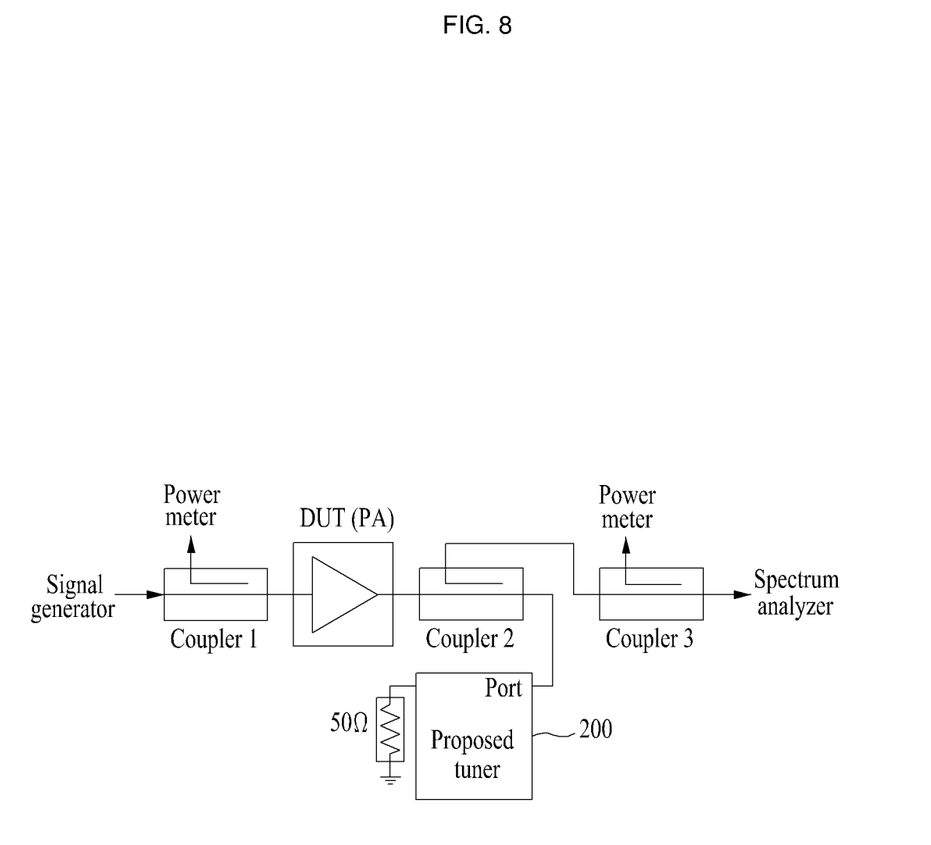
FIG. 8 is a view illustrating a device to perform the measurement of load-full using the device, according to the present invention.

According to an embodiment of the present invention, in the case of the electronic impedance tuner 200, as illustrated in FIG. 8, equipment capable of measuring load-full of the mobile amplifier may be implemented by using a single port circuit network.

In this case, the device according to the present invention may have the gain deviation of 1 dB or less at SWRs=2.5 and 6 and may have lower adjacent channel leakage ratio (ACLR) deviations of 4 dB and 2.4 dB.

As described above, since the electronic impedance tuner according to an embodiment produces a constant impedance, the electronic impedance tuner may be utilized as load pull equipment in place of the conventional mechanical impedance tuner.

In addition, since the electronic impedance tuner according to embodiments of the present invention may produce the constant impedance, the electronic impedance tuner may exhibit a lower-cost, higher-speed, and lighter characteristics when compared with the mechanical tuner.

Figure 9:
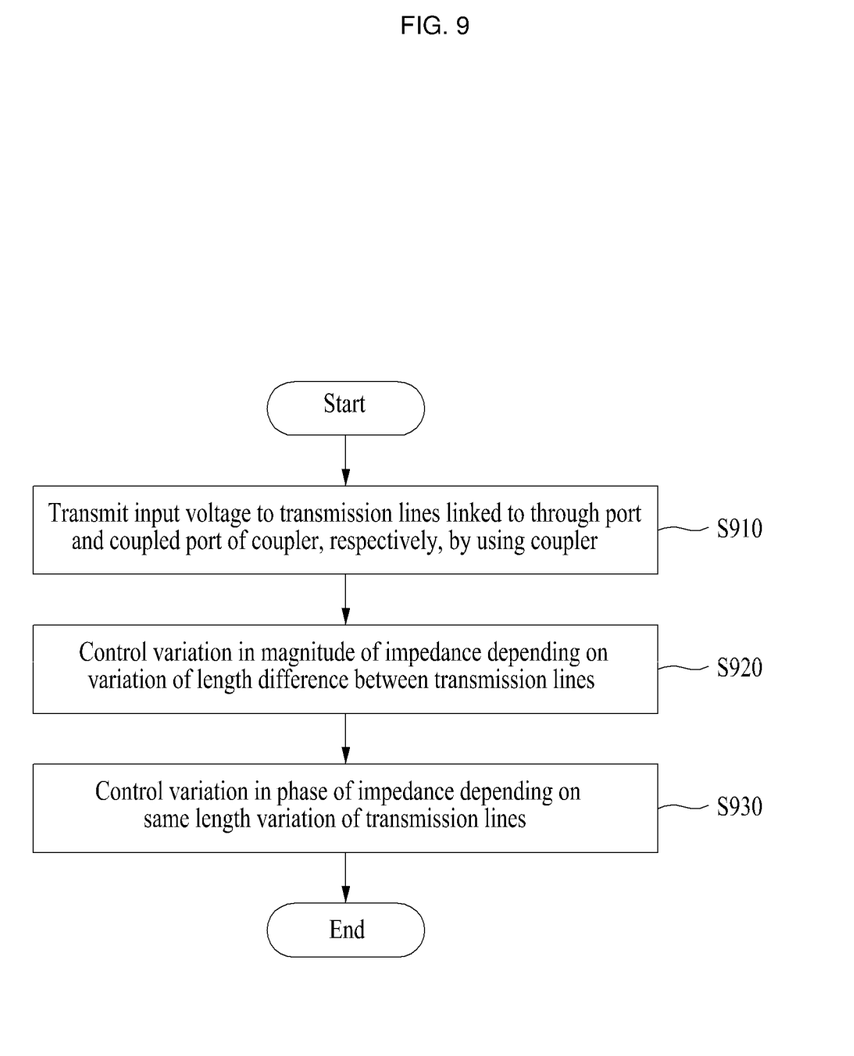
FIG. 9 is a flowchart illustrating an electronic impedance tuning method, according to an embodiment of the present invention.

FIG. 9 is a flowchart illustrating an electronic impedance tuning method according to an embodiment of the present invention, especially, a flowchart illustrating the operation of the electronic impedance tuner.

Referring to FIG. 9, according to an embodiment of the present invention, the electronic impedance tuning method includes transmitting an input voltage to transmission lines linked to a through port and a coupled port of a coupler, respectively, by using the coupler (S910).

In this case, the coupler may be a directional coupler and may include an input port and an isolation port. The isolation port may be terminated with a resistor of 50 Ohm.

When the input voltage is transmitted to each of the transmission lines in step S910, the variation in the magnitude of the impedance is controlled depending on the variation of the length difference between the transmission lines in the magnitude part described above, and the variation in the phase of the impedance is controlled depending on the same length variation of the transmission lines in the phase part (S920 and S930).

Step S920 may be performed in the magnitude part described above and step S930 may be performed in the phase part described above.

In step S920, the variation in the magnitude of the impedance may be controlled in the state that the length of the transmission line linked to the through port is varied and the length of the transmission line linked to the coupled port is fixed.

In this case, in step S920, the length variation of the transmission line linked to the through port may be controlled by selecting at least one of transmission lines having different lengths and linked to each other in parallel. The transmission lines may be switchable by a switch.

In step S920, the length variation of the transmission lines may be controlled such that the sum of electrical phases of the transmission lines in the magnitude part is 90°. The sum of the electrical phases of the transmission lines in the magnitude part may be out of 90° when considering the insertion loss of the circuit depending on situations. In this case, even if the electrical phases of the transmission lines in the magnitude part are out of 90°, only the reference point is changed and the impedances having uniform phase intervals may be produced in the same SWR size.

In step S930, the length of each of the transmission lines may be identically varied to maintain the length difference between the transmission lines in step S920.

In step S930, as at least one of a plurality of transmission lines, which are linked to each other in parallel and have a first phase difference of a predetermined angle, for example, the electrical phase difference of 60°, is selected, the primary phase is determined and any one of a plurality of transmission lines which are linked to each other in series and having a second phase difference of a predetermined angle, for example, an electric phase difference of 7.5° is determined as a short termination point, thereby determining the final phase.

The foregoing systems and devices may be realized by hardware components, software components and/or combinations thereof. For example, the systems, and the devices and components illustrated in the exemplary embodiments of the inventive concept may be implemented in one or more general-use computers or special-purpose computers, such as a processor, a controller, an arithmetic logic unit (ALU), a digital signal processor, a microcomputer, a field programmable array (FPA), a programmable logic unit (PLU), a microprocessor or any device which may execute instructions and respond. A processing unit may perform an operating system (OS) or one or software applications running on the OS. Further, the processing unit may access, store, manipulate, process and generate data in response to execution of software. It will be understood by those skilled in the art that although a single processing unit may be illustrated for convenience of understanding, the processing unit may include a plurality of processing elements and/or a plurality of types of processing elements. For example, the processing unit may include a plurality of processors or one processor and one controller. Also, the processing unit may have a different processing configuration, such as a parallel processor.

Software may include computer programs, codes, instructions or one or more combinations thereof and configure a processing unit to operate in a desired manner or independently or collectively control the processing unit. Software and/or data may be permanently or temporarily embodied in any type of machine, components, physical equipment, virtual equipment, computer storage media or units or transmitted signal waves so as to be interpreted by the processing unit or to provide instructions or data to the processing unit. Software may be dispersed throughout computer systems connected via networks and be stored or executed in a dispersion manner. Software and data may be recorded in one or more computer-readable storage media.

The methods according to the above-described embodiments of the inventive concept may be recorded in computer-readable media including program instructions to implement various operations embodied by a computer. The computer-readable medium may also include the program instructions, data files, data structures, or a combination thereof. The program instructions recorded in the media may be designed and configured specially for the exemplary embodiments of the inventive concept or be known and available to those skilled in computer software. The computer-readable medium may include hardware devices, which are specially configured to store and execute program instructions, such as magnetic media, optical recording media (e.g., CD-ROM and DVD), magneto-optical media (e.g., a floptical disk), read only memories (ROMs), random access memories (RAMs), and flash memories. Examples of computer programs include not only machine language codes created by a compiler, but also high-level language codes that are capable of being executed by a computer by using an interpreter or the like. The described hardware devices may be configured to act as one or more software modules to perform the operations of the above-described exemplary embodiments of the inventive concept, or vice versa.

While a few exemplary embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the scope of the following claims.

The invention claimed is:
1. An electronic impedance tuning apparatus comprising:
a coupler to transmit an input voltage, which is applied to an input port, to transmission lines linked to a through port and a coupled port;
a magnitude part to control a magnitude change of an impedance by changing a length difference between transmission lines; and
a phase part to control a phase change of the impedance based on the same length change of the transmission lines.

2. The electronic impedance tuning apparatus of claim 1, wherein the magnitude part:
controls only a length change of the transmission line linked to the through port; and
maintains a length of the transmission line, which is linked to the coupled port, in a fixed state.

3. The electronic impedance tuning apparatus of claim 2, wherein the magnitude part:
controls the length change of the transmission line linked to the through port by linking a plurality of transmission lines, which have different lengths, to the through port in parallel and by selecting at least one of the plurality of transmission lines.

4. The electronic impedance tuning apparatus of claim 1, wherein the sum of electrical phases of the transmission lines constituting the magnitude part is 90°.

5. The electronic impedance tuning apparatus of claim 1, wherein the phase part is interposed between the magnitude part and a terminal connected to a short circuit to identically vary a length of each of the transmission lines to maintain the length difference between the transmission lines based on a magnitude of an impedance which is determined by the magnitude part.

6. The electronic impedance tuning apparatus of claim 5, wherein the phase part includes:
   a start-point part having a plurality of transmission lines making a first phase difference having a specific angle and linked to each other in parallel, and selecting at least one of the transmission lines to determine a primary phase; and
   a loaded-line part having a plurality of transmission lines, which have a second phase difference having a specific angle and are linked to each other in series, and determining one of the transmission lines, which are linked to each other in series, as a short termination point to determine a final phase.

7. The electronic impedance tuning apparatus of claim 1, wherein the coupler includes a 3-dB 90° directional coupler.

8. An electronic impedance tuning method comprises:
   transmitting an input voltage to transmission lines linked to a through port and a coupled port of a coupler by using the coupler;
   controlling a magnitude of an impedance by changing a length difference between the transmission lines; and
   controlling a phase of the impedance by identically changing lengths of the transmission lines.

9. The electronic impedance tuning method of claim 8, wherein the controlling of the magnitude of the impedance includes:
   controlling only a length change of the transmission line linked to the through port; and
   maintaining a length of the transmission line, which is linked to the coupled port, in a fixed state.

10. The electronic impedance tuning method of claim 9, wherein the controlling of the magnitude of the impedance includes:
    controlling the length change of the transmission line linked to the through port by selecting at least one of a plurality of transmission lines liked to the through port in parallel and having different lengths.

11. The electronic impedance tuning method of claim 8, wherein the controlling of the magnitude of the impedance includes:
    controlling length changes of the transmission lines such that the sum of electrical phases of the transmission lines becomes 90°.

12. The electronic impedance tuning method of claim 8, wherein the controlling of the phase of the impedance includes:
    identically varying a length of each of the transmission lines to maintain the length difference between the transmission lines based on a magnitude of an impedance which is determined in the controlling of the magnitude of the impedance.

13. The electronic impedance tuning method of claim 12, wherein the controlling of the phase of the impedance includes:
    determining a first phase by selecting at least one of a plurality of transmission lines linked to each other in parallel and having a first phase difference having a specific angle; and
    determining a final phase by determining one of a plurality of transmission lines, which are linked to each other in series and have a second phase difference having a specific angle, as a short termination point.

* * * * *